United States Patent [19]

Hirasawa et al.

[11] 3,829,710

[45] Aug. 13, 1974

[54] LOGIC CIRCUIT ARRANGEMENT USING INSULATED GATE FIELD EFFECT TRANSISTORS

[75] Inventors: Masataka Hirasawa; Kenji Kawagai, both of Yokohama, Japan

[73] Assignee: Tokyo Shibaura Electric Co. Ltd., Kawasaki-shi, Japan

[22] Filed: Aug. 20, 1973

[21] Appl. No.: 389,535

[30] Foreign Application Priority Data

Aug. 30, 1972 Japan ............ 47-86892
Aug. 30, 1972 Japan ............ 47-86893
Aug. 30, 1972 Japan ............ 47-86894

[52] U.S. Cl. ............ 307/205, 307/215, 307/246
[51] Int. Cl. ............ H03k 19/08, H03k 19/36
[58] Field of Search ............ 307/205, 214, 215, 246, 307/251, 279

[56] References Cited

UNITED STATES PATENTS

| | | | |
|---|---|---|---|
| 3,526,783 | 9/1970 | Booher | 307/251 X |
| 3,601,627 | 8/1971 | Booher | 307/205 |
| 3,603,816 | 9/1971 | Podraza | 307/214 X |
| 3,737,673 | 6/1973 | Suzuki | 307/215 X |

OTHER PUBLICATIONS

Gurski, "Fet Logic Bridge Circuit," IBM Tech. Discl. Bull.; Vol. 11, No. 7, pp. 812; 12/1968.
Radzik, "Four-Phase Dynamic Polarity-Hold Latch," IBM Tech. Discl. Bull.; Vol. 14, No. 7, pp. 2107–2108; 12/1971.

*Primary Examiner*—Rudolph V. Rolinec
*Assistant Examiner*—L. N. Anagnos
*Attorney, Agent, or Firm*—Flynn & Frishauf

[57] ABSTRACT

A logic circuit arrangement includes a first transistor having the source-drain conduction path connected between a first power source terminal and an output point and rendered conductive in response to a clock pulse applied to the gate electrode, and a plurality of second transistors, constituting at least one logic gate, each having the source-drain conduction path connected between the output point and a second power source terminal and the gate electrode supplied with a logic input. The arrangement is such that current is not concurrently flowed between the first power source terminal and the output point and between the output point and the second power source terminal. The source-drain conduction path of a third transistor is further connected between the first power source terminal and a junction of the adjacent two transistors in the logic gate and rendered conductive, during the conduction of the first transistor, in response to a clock signal applied to the gate electrode, so that a voltage of the output point indicates a predetermined level corresponding to a logic "1" or "0" irrespective of the difference of operation mode of each transistor.

14 Claims, 10 Drawing Figures

LOGIC CIRCUIT ARRANGEMENT USING INSULATED GATE FIELD EFFECT TRANSISTORS

This invention relates to a logic circuit arrangement using insulated gate field effect transistors.

Conventionally known is a logic circuit arrangement including first and second power source terminals between which an operation voltage is applied, an output point, a first transistor of a first channel type having the source-drain conduction path connected between the first power source terminal and the output point and rendered conductive in response to a clock signal applied to the gate electrode, and a logic gate including a plurality of second transistors of a second channel type each having the source-drain conduction path connected between the output point and the second power source terminal and the gate electrode supplied with a logic input, and arranged so that current is not concurrently flowed between the first power source terminal and the output point and between the output point and the second power source terminal.

To prevent the concurrent flow of the current, attempt is made to apply to the second power source terminal a complement of a clock pulse applied to the gate electrode of the first transistor; or to connect a second channel type third transistor, in series with the logic gate, between the output point and the second power source terminal in a manner that the gate electrode of the third transistor is supplied with a clock pulse the same as the clock pulse applied to the gate electrode of the first transistor; or to apply, to the gate electrode of at least one of the second transistors constituting the logic gate, an AND output or an OR output both including the clock pulse and one logic input.

Such circuit arrangement involves a lesser power consumption due to no concurrent establishment of the current path between the first power source terminal and the output point and the current path between the output point and the second power source terminal and requires a very small number of transistors. In this respect it is very suitable for an integrated circuit.

The insulated gate field effect transistor has two kinds of operation mode: a source follower mode and a source grounded mode. The source follower mode is of such a type that the drain is a fixed-bias state, or the potential of the source is determined by the potential of the drain. The output voltage of the source is saturated at a voltage drop a threshold voltage ($Vth$) from a voltage level supplied to the gate electrode, and a switching speed is slow. On the other hand, the source grounded mode is of such a type that the source is in the fixed-bias state, or the potential of the drain is determined by the potential of the source. The output voltage level of the drain normally becomes equal to the potential of the source and the switching speed is very quick. Generally, out of the second transistors constituting a logic gate, one or more transistors other than one or more transistors whose sources are connected to the second power source terminal or ground are operated, in a source follower mode, during some portion of one cycle of clock pulse signal and operated, in a source grounded mode, during the remaining portion of one cycle of the clock pulse signal. During the source follower mode period, therefore, an operation speed is slow and a relatively long time is required until the operation becomes stable. During this period a time is required until the voltage levels of the output point and a junction of two transistors constituting the logic gate become a normal value. For this reason it is difficult to render an operation frequency or a clock signal frequency higher than a predetermined extent. When a higher frequency is so attained, an output voltage level is rendered lower than a predetermined extent, resulting in an unstable operation of a logic circuit. This phenomenon is more often observed when more transistors are series-connected in a logic gate.

An object of this invention is to provide a logic circuit arrangement capable of effecting a stable and positive operation to a clock pulse signal of higher frequency.

According to this invention there is provided a logic circuit arrangement comprising first and second power source terminals between which an operating voltage may be applied; an output point; a circuit point; a first transistor having a conduction path connected between the first power source terminal and the output point and conducted for a predetermined time period in response to a first clock pulse signal applied to the gate electrode; logic gate means including at least two second transistors whose conduction paths are series-connected between the output point and the second power source terminal and whose respective gate electrodes are supplied with a logic input, a junction of the series-connected adjacent transistors connected to the circuit point; a third transistor having a conduction path connected between the first power source terminal and the circuit point and adapted to be conducted, during the conduction period of the conduction path of the first transistor, in response to a second clock pulse signal applied to the gate electrode; and means for preventing a current flow from one of the first and second power source terminals to the other.

This invention can be more fully understood from the following detailed description when taken in connection with reference to the accompanying drawings, in which.

Figure 1:
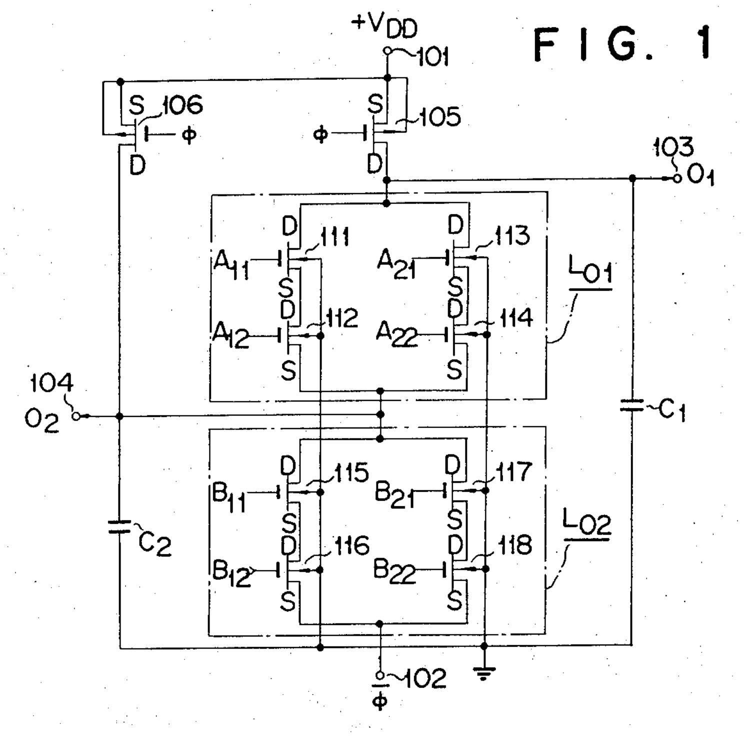
FIG. 1 is a circuit diagram showing a logic circuit arrangement according to one embodiment of this invention.
Figure 2:
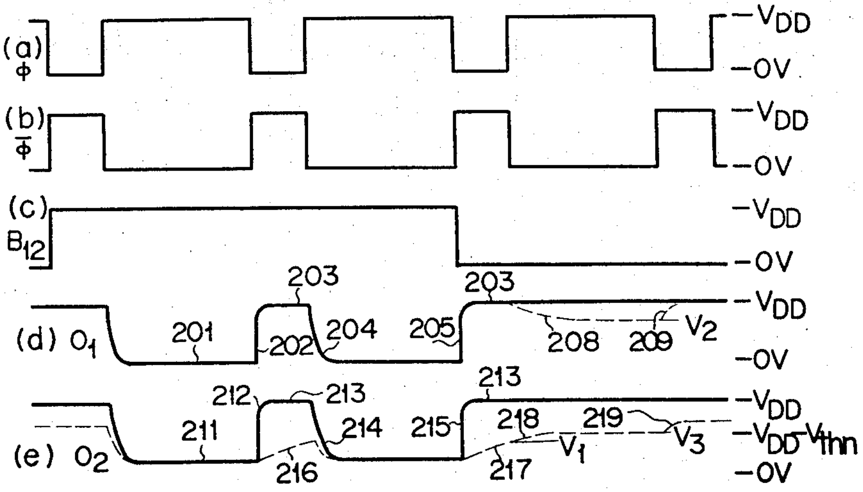
FIG. 2 shows waveforms representation used in explaining the operation of a logic circuit arrangement of FIG. 1.

Let us now explain the embodiment of this invention by reference to FIGS. 1 and 2.

Though a negative logic can be, of course, used, there is used by way of explanation a positive logic in which a high voltage level is represented by a binary "1" and a low voltage level is represented by a binary "0." Throughout the drawings, S denotes a source of a transistor and D denotes a drain of the transistor. An arrow indicated between S and D shows a substrate of each transistor. The direction of the arrow indicates whether the transistor is a *p*-channel type or an *n*-channel type. In a case of the *p*-channel transistor, the arrow is directed towards the outside and, in a case of the *n*-channel transistor, the arrow is directed towards the inside.

Between a first power source terminal 101 and a first output point 103 is connected a conduction path of a

*p*-channel transistor 105 whose gate electrode is supplied with a clock signal $\phi$. A first logic gate LO1 and a second logic gate LO2 are series-connected between the first output point 103 and a second power source terminal 102 which is supplied with a clock signal $\overline{\phi}$. The first logic gate LO1 consists of, for example, *n*-channel transistors 111 and 112 whose conduction paths are series-connected, and series-connected *n*-channel transistors 113 and 114 arranged in parallel with the series-connected *n*-channel transistors 111 and 112. Logic inputs or data inputs A11, A12, A21 and A22 are supplied to logic transistors 111, 112, 113 and 114, respectively. The second logic gate LO2 consists of *n*-channel transistors 115, 116, 117 and 118 connected in a manner similar to the connection of the transistors 111, 112, 113 and 114 of the first logic gate LO1. The gate electrodes of transistors 115, 116, 117 and 118 are supplied with data inputs B11, B12, B21 and B22, respectively. The sources of the logic transistors 112 and 114 and the drains of the logic transistors 115 and 117 are both connected to a second output point 104.

Between the first power source terminal 101 and the second output point 104 is connected a conduction path of a *p*-channel transistor 106 whose gate electrode is supplied with a clock signal $\phi$. The substrates of the *p*-channel transistors 105 and 106 are connected to the first power source terminal 101 to which a high level power source voltage +VDD is applied. The substrates of the *n*-channel transistors 111–118 are grounded. Capacitances C1 and C2 indicate output or load capacitances distributing at the first and second output points 103 and 104.

When a clock signal $\phi$ is a binary "0" or a zero volt, then the transistors 105 and 106 are conducted to cause the capacitances C1 and C2 to be charged up to +VDD volt to permit first and second outputs O1 and O2 of a binary "1" to be generated. At this time the second power source terminal 102 is supplied with $\overline{\phi}$, i.e., +VDD volt and thus the first and second power source terminals 101 and 102 are at the same potential. Therefore no current is flowed from the first power source terminal 101 to the second power source terminal 102.

When $\phi = 1$, then the *p*-channel transistors 105 and 106 are both in the non-conductive state and the second power source terminal 102 becomes a ground potential. When, at this time, data inputs B11 and B12 or B21 and B22 are both in a binary "1," for example, B11 = 1, B12 = 1, B21 = 1 and B22 = 0, then the transistors 115, 116 and 117 are conducted and the transistor 118 becomes non-conductive. Between the second output point 104 and the second power source terminal 102 a current path is established. As a result, the capacitance C2 charged up to +VDD is discharged through the current path and is reduced to be a zero volt. Where at least one of the logic inputs B11 and B12 and at least one of the logic inputs B21 and B22 are both in a logic "0" state, at least one of the transistors 115 and 116 and at least one of the transistors 117 and 118 become non-conductive and thus no current path is created between the second output terminal 104 and the second power source terminal 102. Thus, the charged voltage of the capacitance C2 prevalent at $\phi = 0$ is held. That is, the second output O2 obtained at $\phi = 1$ is indicated by $$O2 = \overline{B11 \cdot B12 + B21 \cdot B22}.$$

Suppose that, at $\phi = 1$, a current path is established between the second output terminal 104 and the second power source terminal 102, i.e., $$B11 \cdot B12 + B21 \cdot B22 = 1.$$

When, at this time, logic inputs A11 and A12 and/or A21 and A22 are in the logic "1" state, for example, A11 = A12 = 0, A21 = A22 = 1, the transistors 111 and 112 become non-conductive and the transistors 113 and 114 become conductive. Accordingly, between the first output point 103 and the second power source terminal 102 a current path is created, and the voltage of the capacitance C1 charged at $\phi = 0$ is discharged. As a result, the first output O2 becomes a 0 volt, i.e., a logic "0." On the other hand, when at least one of logic inputs A11 and A12 and at least one of A21 and A22 are in the logic "0" state, no current path is established between the first output point 103 and the second power source terminal 102, and that voltage +VDD volt, i.e., logic "1" of the capacitance C1 prevalent at $\phi = 0$ is held. When no current path is created between the output point 104 and the second power source terminal 102, i.e., $$B11 \cdot B12 + B21 \cdot B22 = 0,$$

no current path is created between the first output point 103 and the second power source terminal 102 and the first output O1 of a logic "0" prevalent at $\phi = 0$ is held. That is, the first output O1 is indicated by $$01 = \overline{(A11 \cdot A12 + A21 \cdot A22) \cdot (B11 \cdot B12 + B21 \cdot B22)}.$$

With the embodiment of FIG. 1 the output O2 can be used, as required, as output of the second logic gate LO2 as well as the output O1 of the first logic gate LO1. The use of the output O2 is necessarily required. According to this invention, at least two transistors, for example, the transistors 112 and 115 are series-connected and the transistor 106 may be connected between the junction of two transistors or circuit point 104 and the first power source terminal 101. The transistors 105 and 106 are not necessarily required to be of *p*-channel type and the other transistors identical to the transistors 111–118 of *n*-channel type will do. In this case, clock signals $\overline{\phi}$ may be applied to the gate electrodes of the transistors respectively. The fixed potential +VDD is not necessarily required to be supplied to the first power source terminal and a clock signal $\overline{\phi}$ may be applied to the first power source terminal 101.

FIG. 2 shows waveforms representation obtained when data inputs A11, A12 and B11 are all in the logic "1" state and A21, A22, B21 and B22 are all in the logic "0" state, that is, the transistors 111, 112 and 115 are always in the ON state and the transistors 113, 114, 117 and 118 are always in the OFF state. When a signal B12 as shown in FIG. 2c is supplied to the gate of the transistor 116, a first output 01 and a second output O2 have waveforms as shown by the solid lines in FIGS. 2d and 2e, respectively. Out of wave forms *d* and *e* of the outputs O1 and O2, the voltage level of portions 201 and 211 is a voltage level prevalent at $B12 = 1$ and $\phi = 1$, that is, a ground potential or a logic "0." The voltage level of the portions 203 and 213 is a normal voltage level of +VDD volt, or a logic "1," when $\phi = 0$ or when $B12 = 0$ and $\phi = 1$. The switching portions 202 and 205 of the output O1 and switching portions 212 and 215 of the output O2 are waveforms obtained when the output points 103 and 104 are charged from a zero volt up to +VDD volt. At this time, the transistors 105 and 106 are operated in a source grounded mode and the capacitances C1 and C2 are charged for a short time period. The switching portions 204 and 214 of the output waveforms indicate the discharged wave forms of the capacitances C1 and C2 prevalent at $\phi = 1$ and $B12 = 1$. Since, in this case, the transistors 111, 112, 115 and 116 are operated in a source grounded mode, the capacitances C1 and C2 are discharged during a short time period. However, a switching speed at the discharge time is longer than a switching speed at the charging time dependent upon the total resistive value of conduction paths of the series-connected transistors constituting a current path.

In the waveforms of the outputs O1 and O2 the dotted lines denote output waveforms obtained when the transistor 106 is not used. The portion 216 of the waveform of the output O2 represents a charged waveform obtained when, during the time period $\phi = 0$, the capacitance C2 is charged, with the voltage +VDD, through the transistors 105, 111 and 112 and charged by the clock signal $\overline{\phi}$ through the transistors 115 and 116. The portion 217 of the waveform of the output O2 represents a charged waveform obtained when, during the time period $\phi = 0$, the capacitance C2 is charged, by the voltage +VDD, through the transistors 105, 111 and 112. In this case, the transistor 105 is operated in a source grounded mode, while the transistors 111, 112, 115 and 116 are operated in a source follower mode. In this case, during the time period $\phi = 0$, the capacitance C2 can not be charged up to a saturated voltage (+VDD − threshold voltage $Vth$). Suppose that a charged voltage of the capacitance C2 prevalent as the end of $\phi = 0$ is V1. Then, the voltage of the capacitance C1 is +VDD volt. The portion 208 of the output O1 and the portion 218 of the output O2 represent a process in which a charged voltage +VDD of the capacitance C1 further charges, through the transistors 111 and 112, the capacitance C1 charged to a voltage V1. It is because that even if at $\phi = 1$ and $B12 = 0$ the transistors 105 and 116 are turned OFF, the transistors 111 and 112 are turned ON. Voltages V2 and V3 of the outputs O1 and O2 present at the end of the process are, $$\text{when } VDD-Vth \geq C1 \cdot VDD + C2 \cdot V1/C1 + C2,$$

$$V2 = V3 = C1 \cdot VDD + C2 \cdot V1/C1 + C2, \text{ and}$$

$$\text{when } VDD-Vth < C1 \cdot VDD + C2 \cdot V1/C1 + C2,$$

$$V2 = VDD - (VDD - Vth - V1) \cdot C2/C1 \text{ and}$$

$$V3 = VDD - Vth$$

The switching portions 209 and 219 show a process in which, after a clock signal $\phi$ is reduced to zero, the capacitance C1 is charged up to +VDD while the capacitance C2 is charged up to VDD−Vth.

The potential V2 of the output waveform O1 is offset relative to the potential VDD of a normal logic "1" level and the operation of the logic circuit becomes unstable. The potential V3 of the output waveform O2 is sometimes lower than the potential V2 and it can not be utilized as an output signal. In an attempt to obtain a stable output voltage level it is necessary to further extend the period $\phi = 0$. From this it will be understood that it is difficult to obtain a high operating frequency.

Figures 3, 4:
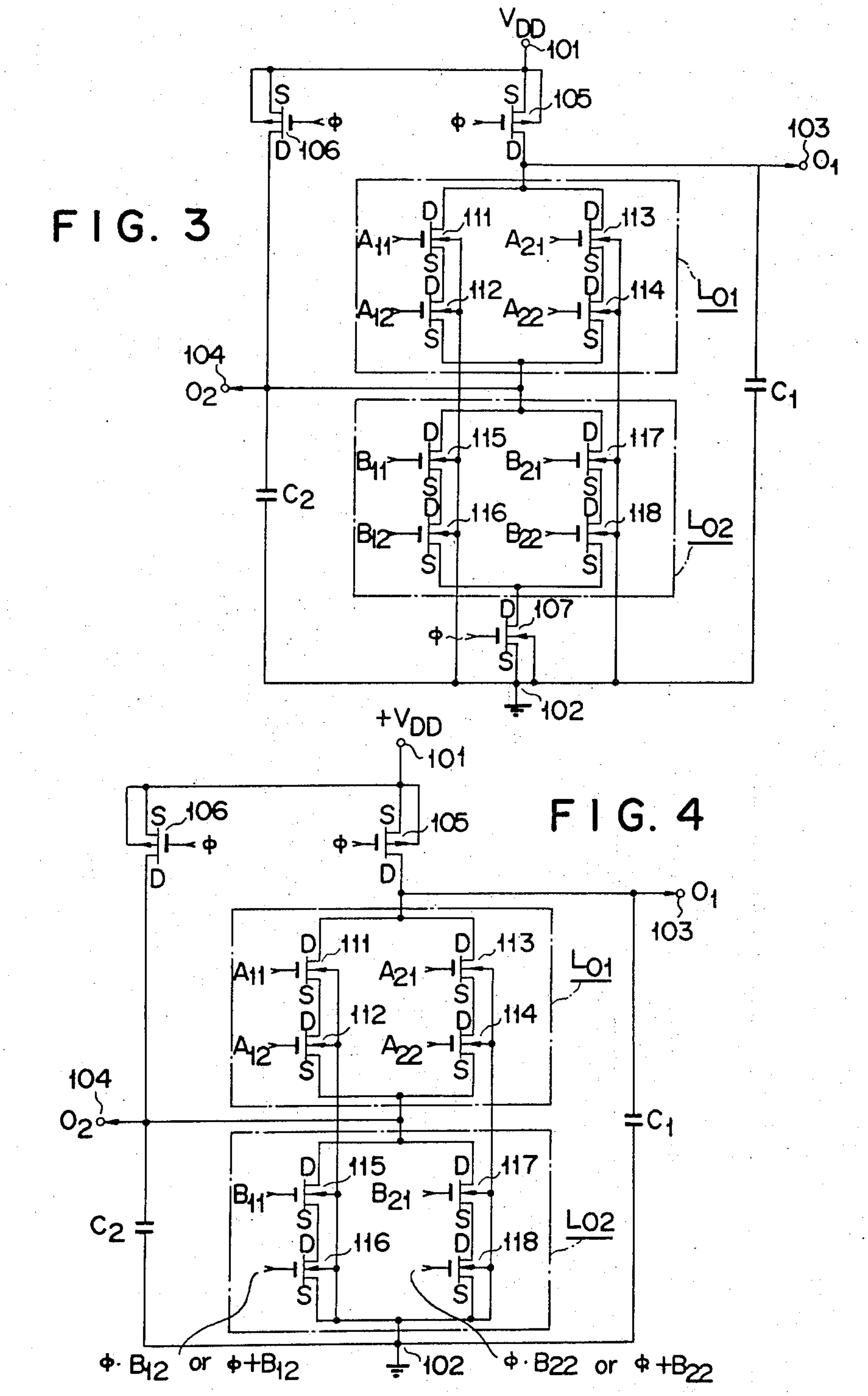
FIG. 3 is one modification of FIG. 1.
FIG. 4 is another modification of FIG. 1.

FIG. 3 shows one modification of FIG. 1. Between the second output point 104 and a second power source terminal or ground 102 is connected in series with the logic gate LO2 a conduction path of an $n$-channel transistor 107 whose gate electrode is supplied with a clock signal $\phi$. The transistor 107 and transistors 105 and 106 are opposite in channel type to each other and the same clock signal $\phi$ is applied to each gate of these transistors 107, 105 and 106. Therefore, no current path is created from a first power source terminal 101 to the second power source terminal 102.

In FIG. 4, an AND output $\phi \cdot B12$ including a clock signal $\phi$ and a data signal B12 is supplied to the gate electrode of the transistor 116 included in the second logic gate LO2 and an AND output $\phi \cdot B22$ including a clock signal $\phi$ and a data signal B22 is applied to the gate electrode of the transistor 118. Therefore, when $p$-channel transistors 105 and 106 are conducted, the $n$-channel transistors 116 and 118 are not absolutely conducted. The reverse is also true. Even in this case, no current path is established from the first power source terminal 101 to the second power source terminal 102. Where a negative logic is used, an OR output $\phi + B12$ including a clock signal $\phi$ and a data signal B12 is supplied to the gate electrode of the transistor 116, and an OR output $\phi + B22$ including a clock signal $\phi$ and a data signal B22 is supplied to the gate electrode of the transistor 118.

Figure 5A:
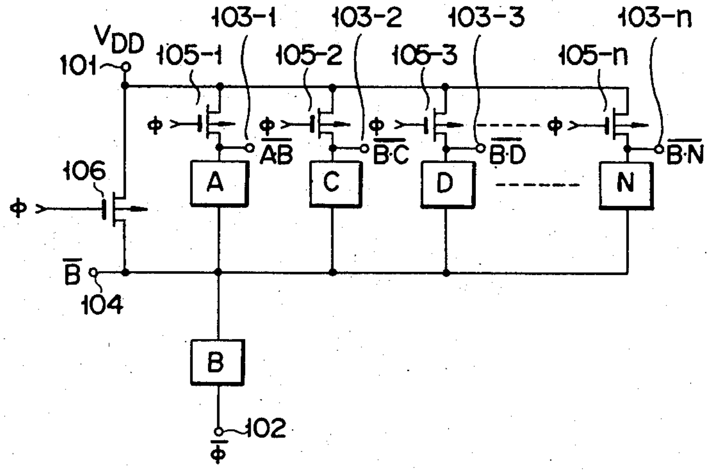
FIGS. 5A–5B, 6A–6B and 7A–7B show further modifications of the logic circuit arrangement according to this invention.
Figures 5B, 6A:
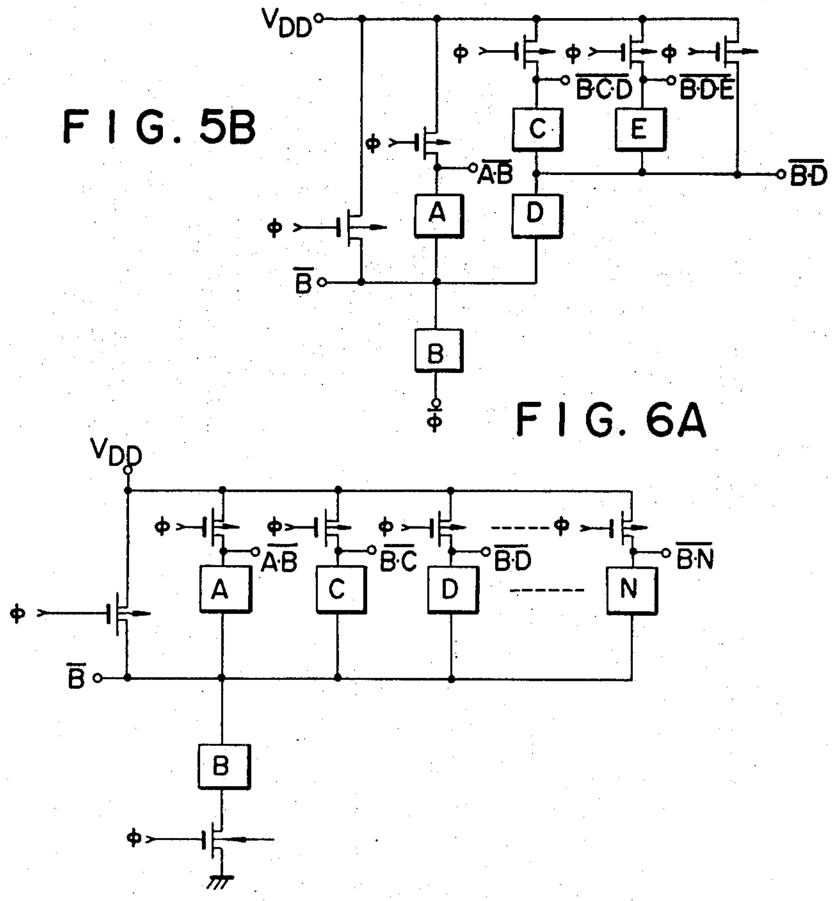
Figure 6B:
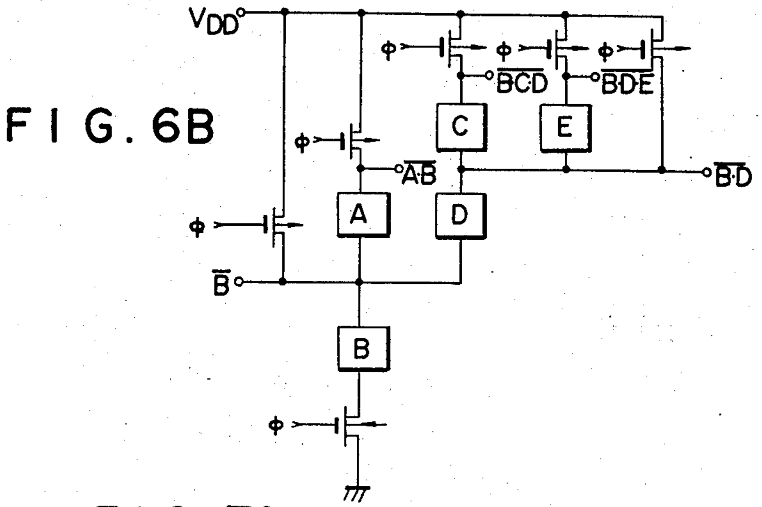
Figures 7A, 7B:
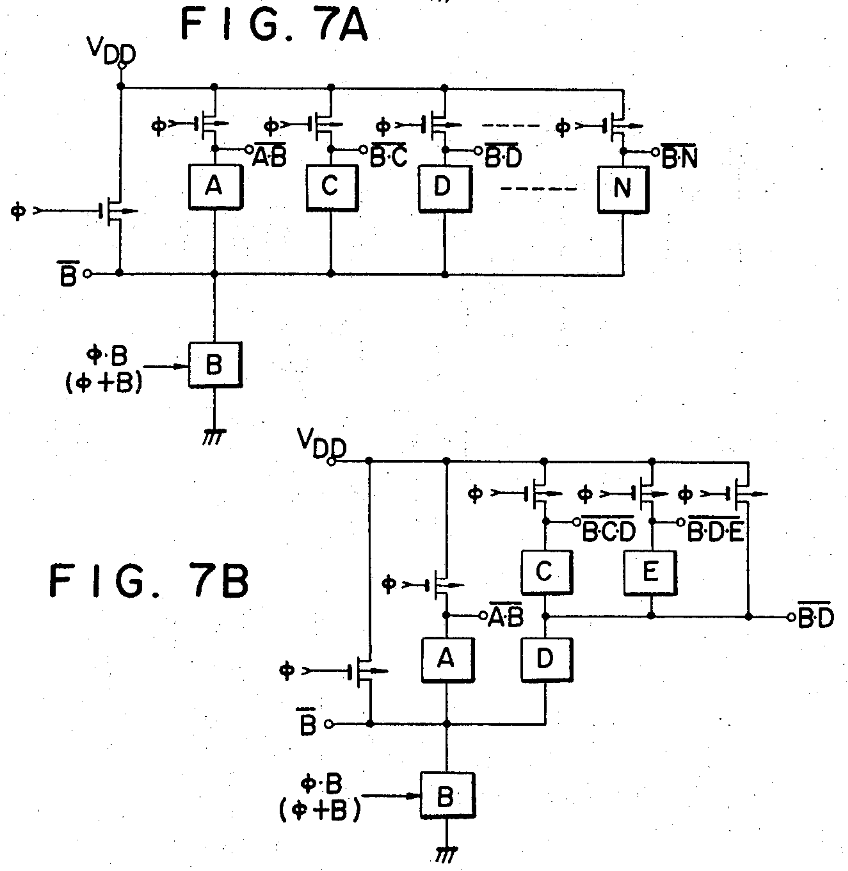

FIGS. 5A–5B, 6A–6B and 7A–7B show other embodiments including first logic gates A, C, D ... N and a second common logic gate B including $n$-channel transistors, respectively. Between a first power source terminal 101 and first output points 103-1, 103-2, 103-3 ... 103-$n$ are connected transistors 105-1, 105-2 ... 105-$n$. More than one first logic gate may be connected between each output terminal and a second output terminal 104. FIGS. 5A–5B correspond to the embodiment of FIG. 1; FIGS. 6A–6B to the embodiment of FIG. 3; and FIGS. 7A–7B to the embodiment of FIG. 4. The operation of these embodiments will be easily understood based on each embodiment of FIGS. 1, 3 and 4.

What we claim is:

1. A logic circuit arrangement using insulated gate field effect transistors each having a gate electrode, and source and drain regions defining a conduction path therebetween, said arrangement comprising:

first and second power source terminals between which an operating voltage may be applied;

an output point;

a circuit point;

a first transistor having a conduction path connected between said first power source terminal and said output point and conducted for a predetermined time period in response to a first clock pulse signal applied to the gate electrode;

logic gate means including at least two second transistors whose conduction paths are series-connected between said output point and said second power source terminal and whose respective gate electrodes are supplied with a logic input, a junction of said series-connected adjacent transistors connected to said circuit point;

a third transistor having a conduction path connected between said first power source terminal and said circuit point and adapted to be conducted, during the conduction period of the conduction path of said first transistor, in response to a second clock pulse signal applied to the gate electrode; and means for preventing a current flow from one of said first and second power source terminals to the other.

2. A logic circuit arrangement according to claim 1 in which said first and third transistors are opposite in channel type to said second transistors.

3. A logic circuit arrangement according to claim 1 in which said last-mentioned means includes means for applying an AND output or an OR output both including a clock pulse signal and a logic input signal to the gate electrode of at least one of said second transistors connected between said circuit point and said second power source terminal.

4. A logic circuit arrangement according to claim 1 in which said last-mentioned means includes a fourth transistor whose conduction path is series-connected, between said circuit point and said second power source terminal, to the conduction path of at least one of said second transistors, and whose gate electrode is supplied to a clock pulse signal.

5. A logic circuit arrangement according to claim 1 in which said last-mentioned means includes means for applying a clock pulse signal to at least second power source terminal.

6. A logic circuit arrangement according to claim 1 in which said first and third transistors are different in channel type from said second transistors; at least one second transistor is connected between said output point and said circuit point to constitute a first logic gate; at least one second transistor is connected between said circuit point and said second power source terminal to constitute a second logic gate; and said circuit point is utilized to derive a logic output of said second logic gate.

7. A logic circuit arrangement using insulated gate field effect transistors each having a gate electrode and source and drain regions defining a conduction path therebetween said logic circuit comprising:

first and second power source terminals between which an operating voltage may be applied;

a plurality of output points;

a circuit point;

a plurality of first transistors each having a conduction path connected between said first power terminal and the output point and conducted for a predetermined time period in response to a first clock pulse signal applied to the gate electrode thereof;

at least one first logic gate means connected between the respective output point and said circuit point and including at least one second transistor whose gate electrode is supplied with a logic input;

a second logic gate means connected between said circuit point and said second power source terminal and including at least one second transistor whose gate electrode is supplied with a logic input;

a third transistor having a conduction path connected between said first power source terminal and said circuit point and conducted, during the conduction period of the conduction path of said first transistor, in response to a second clock pulse signal applied to the gate electrode thereof; and means for preventing a current flow from one of said first and second power source terminals to the other.

8. A logic circuit arrangement according to claim 7 in which said second transistors are opposite in channel type to said first and third transistors.

9. A logic circuit arrangement according to claim 7 in which said last-mentioned means includes means for applying an AND output or an OR output both including a clock pulse signal and a logic input to the gate electrode of at least one second transistor included in said second logic gate means.

10. A logic circuit arrangement according to claim 7 in which said last-mentioned means includes a fourth transistor having a conduction path connected in series, between said circuit point and said second power source terminal, with said second logic gate means, and a gate electrode supplied with a clock signal.

11. A logic circuit arrangement according to claim 7 in which said last-mentioned means includes means for applying a clock pulse signal to at least said second power source terminal of said first and second power source terminals.

12. A logic circuit arrangement using insulated gate field effect transistors each having source and drain regions defining a conduction path therebetween and a gate electrode, said logic circuit arrangement comprising:

first and second power source terminals between which an operating voltage may be applied;

first and second output points;

a first transistor of a first channel type having a conduction path connected between said first power source terminal and said first output point, and conducted for a predetermined time period in response to a clock pulse signal applied to the gate electrode thereof;

a first logic gate means including at least one second transistor of a second channel type opposite to the first channel type having a conduction path connected between said first and second output points, the gate electrode of the second channel type transistor being supplied with a logic input;

a second logic gate means including at least one third transistor of the second channel type having a conduction path connected between said second output point and said second power source terminal, the gate electrode of the second channel type third transistor being supplied with a logic input;

a further transistor of the first channel type having a conduction path connected between said first power source terminal and said second output point and conducted, during the conduction period of the conduction path of said first transistor, in response to a clock pulse signal applied to the gate electrode thereof; and means for applying a clock pulse signal to at least said second power source terminal of said first and second power source terminals.

13. A logic circuit arrangement using insulated gate field effect transistors each having source and drain regions defining a conduction path therebetween and a gate electrode, said logic circuit arrangement comprising:

first and second power source terminals between which an operating voltage may be applied;

first and second output points;

a first channel type first transistor having a conduction path connected between said first power source terminal and said first output point and conducted, for a predetermined time period, in response to a clock pulse applied to the gate electrode thereof;

a first logic gate means including at least one second transistor of a second channel type opposite to said first channel type connected between said first output point and said second output point, the gate electrode of said second transistor being supplied with a logic input;

a second logic gate means including at least one third transistor of the second channel type having a conduction path connected between said second output point and said second power source terminal, the gate electrode of said third transistor being supplied with a logic input;

a fourth transistor of the first channel type connected between said first power source terminal and said second output point and conducted, during the conduction period of the conduction path of said first transistor, in response to a clock pulse signal applied to the gate electrode thereof; and a fifth transistor of the second channel type having a conduction path connected, between said second power source terminal and said second output point, in series with said second logic gate means and conducted in response to the clock pulse signal applied to the gate electrode thereof.

14. A logic circuit arrangement using insulated gate field effect transistors each having source and drain regions defining a conduction path therebetween and a gate electrode; said logic circuit arrangement comprising:

first and second power source terminals between which an operating voltage may be applied;

first and second output points;

a first transistor of a first channel type having a conduction path connected between said first power source terminal and said first output point and conducted, during a predetermined time period, in response to a clock pulse signal applied to the gate electrode thereof;

a first logic gate means including at least one second transistor of a second channel type opposite to the first channel type having a conduction path connected between said first and second output points, the gate electrode of said second transistor being supplied with a logic input;

a second logic gate means including at least one third transistor of the second channel type having a conduction path connected between said second output point and said second power source terminal, the gate electrode of said third transistor being supplied with a logic input;

a fourth transistor of the first channel type having a conduction path connected between said first power source terminal and said second output point and conducted, during the conduction period of the conduction path of said first transistor, in response to a clock pulse signal applied to the gate electrode; and means for applying an AND output or an OR output both including a clock pulse signal and a logic input to the gate electrode of at least one of said third transistors included in said second logic gate.

* * * * *